US007884625B2

(12) United States Patent
Bartley et al.

(10) Patent No.: US 7,884,625 B2
(45) Date of Patent: *Feb. 8, 2011

(54) CAPACITANCE STRUCTURES FOR DEFEATING MICROCHIP TAMPERING

(75) Inventors: Gerald K Bartley, Rochester, MN (US); Darryl J Becker, Rochester, MN (US); Paul E Dahlen, Rochester, MN (US); Philip R Germann, Oronoco, MN (US); Andrew B Maki, Rochester, MN (US); Mark O Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 260 days.

This patent is subject to a terminal disclaimer.

(21) Appl. No.: 12/181,365

(22) Filed: Jul. 29, 2008

(65) Prior Publication Data

US 2010/0026313 A1 Feb. 4, 2010

(51) Int. Cl.
*G01R 27/26* (2006.01)

(52) U.S. Cl. .......................... 324/686; 324/548; 361/56

(58) Field of Classification Search ................. 324/548, 324/686, 76.11; 361/56

See application file for complete search history.

(56) References Cited

U.S. PATENT DOCUMENTS

| | | | | |
|---|---|---|---|---|
| 4,288,829 | A * | 9/1981 | Tango | 361/56 |
| 5,117,457 | A | 5/1992 | Comerford et al. | |
| 5,177,352 | A | 1/1993 | Carson et al. | |
| 5,790,670 | A | 8/1998 | Bramlett | |
| 5,889,306 | A | 3/1999 | Christensen et al. | |
| 6,121,659 | A | 9/2000 | Christensen et al. | |
| 6,264,108 | B1 | 7/2001 | Baentsch | |
| 6,396,400 | B1 | 5/2002 | Epstein, III et al. | |
| 7,005,733 | B2 | 2/2006 | Kommerling et al. | |

* cited by examiner

*Primary Examiner*—Vincent Q Nguyen
(74) *Attorney, Agent, or Firm*—Toler Law Group

(57) ABSTRACT

Apparatus, method and program product may detect an attempt to tamper with a microchip by detecting an unacceptable alteration in a measured capacitance associated with capacitance structures proximate the backside of a microchip. The capacitance structures typically include metallic shapes and may connect using through-silicon vias to active sensing circuitry within the microchip. In response to the sensed change, a shutdown, spoofing, self-destruct or other defensive action may be initiated to protect security sensitive circuitry of the microchip.

20 Claims, 3 Drawing Sheets

190
192
MEASURE CAPACITANCE
194
EXPECTED RANGE?
Y
N
196
INITIATE DEFENSIVE ACTION

| 102 | 104 | 106 | 108 | 110 | 112 | 114 |
|---|---|---|---|---|---|---|
| mils | | | | pF/cm | | |
| D78 | D80 | D82 | WIDTH | C83 | C88 | C90 |
| 3.5 | 35 | 3 | 9 | 0.786 | 2.91 | 2.91 |
| 8 | 35 | 3 | 9 | 0.89 | 2.32 | 2.32 |
| HUGE | 35 | 3 | 9 | 0.8 | 1.56 | 1.56 |
| 3.5 | 35 | 3 | 29 | 0.94 | 5.7 | 5.7 |
| 8 | 35 | 3 | 29 | 1 | 4 | 4 |
| HUGE | 35 | 3 | 29 | 0.94 | 2.35 | 2.35 |
| 3.5 | 35 | 3 | 3 | 0.6 | 1.86 | 1.86 |
| 8 | 35 | 3 | 3 | 0.7 | 1.6 | 1.6 |
| HUGE | 35 | 3 | 3 | 0.6 | 1.15 | 1.15 |

| 132 | 134 | 136 | 138 | 140 | 142 | 144 |
|---|---|---|---|---|---|---|
| mils | | | | pF/cm | | |
| D78 | D80 | D82 | WIDTH | C83 | C88 | C90 |
| 3.5 | 35 | 3 | 9 | 0.786 | 2.91 | 2.91 |
| 8 | 35 | 3 | 9 | 0.89 | 2.32 | 2.32 |
| HUGE | 35 | 3 | 9 | 0.8 | 1.56 | 1.56 |
| HUGE | 30 | 3 | 9 | 0.786 | 1.61 | 1.61 |
| HUGE | 25 | 3 | 9 | 0.737 | 1.66 | 1.66 |

CAPACITANCE STRUCTURES FOR DEFEATING MICROCHIP TAMPERING

FIELD OF THE INVENTION

The present invention relates generally to microchip technologies, and more particularly, to protecting the circuitry and content of microchips.

RELATED APPLICATIONS

The present application relates to co-pending U.S. patent applications entitled "Capacitance-Based Microchip Exploitation Detection" Ser. No. 12/181,342, "Signal Quality Monitoring to Defeat Microchip Exploitation" Ser. No. 12/181,352, "False Connection for Defeating Microchip Exploitation" Ser. No. 12/181,367, "Interdependent Microchip Functionality for Defeating Exploitation Attempts" Ser. No. 12/181,376, "Resistance Sensing for Defeating Microchip Exploitation" Ser. No. 12/181,387, "Continuity Check Monitoring for Microchip Exploitation Detection" Ser. No. 12/181,357, and "Doped Implant Monitoring for Microchip Tamper Detection" Ser. No. 12/181,401, all of which are filed concurrently herewith and which are incorporated by reference in their entireties.

BACKGROUND OF THE INVENTION

Protecting microchip technology deployed in the field is an enormous concern in both military and commercial sectors. Microchips and related devices are routinely acquired by motivated competitors and governments seeking to reverse engineer or otherwise learn the functionality of the technology. Such information is used to make a technological leap in their own devices, or may be used to exploit a perceived weakness in the examined equipment. Sophisticated government and commercial entities thus possess ample strategic and economic motivation to reverse engineer microchip components.

A microchip, or integrated circuit, is a unit of packaged computer circuitry that is manufactured from a material, such as silicon, at a very small scale. Microchips are made for program logic (logic or microprocessors) and for computer memory (Random Access Memory or other memory microchips). Microchips are also made that include both logic and memory, and for special purposes, such as signal, graphics and other processing applications.

An advanced method of reverse engineering select microchip components uses high energy photons, electrons or ions. Focused ion beam processes excite active portions of a microchip to observe how other portions are affected. When used to reverse engineer, these processes are typically done while the microchip is in a powered-on state in order to observe the functionality of the microchip.

Microchip designers in the aerospace, defense and commercial industries routinely implement software and other logic-related techniques to confuse and thwart attempts to probe the active side of the component. For example, safeguard measures integrated within microchips hinder reverse engineering techniques. Microchip designers capitalize on the powered on status required by a reverse engineering process to incorporate a self-destruct or obstructing mechanism into the microchip. The mechanism is triggered by the detection of tampering. When tampering is detected, the power in the circuit is diverted to microchip annihilation or another predetermined measure.

Microchip designers occasionally impede the reverse engineering processes by additionally plating the back of the bulk silicon with a metal layer. While intact, this layer obstructs both the insertion of ions and electrons, and the observation of photons.

While these safeguards provide some protection, motivated exploiters have developed ingenious ways of analyzing the microchip without triggering the safeguard mechanisms. Despite the precautions, the backside of the microchip remains vulnerable to inspection by photons, focused ion beam, or even simple infrared observation. Sophisticated exploitation techniques overcome conventional obstacles by removing the bulk silicon and metallized back layer. For instance, reverse engineering processes may grind away the metallized portion towards implementing a successful focused ion beam operation. In this manner, microchip information may be exploited in a manner that does not initialize a self-destruct feature.

Consequently what is needed is an improved manner of detecting tampering of a microchip.

SUMMARY OF THE INVENTION

The present invention provides an improved method, apparatus and program product for protecting security sensitive circuitry of a microchip from undesired analysis by providing, in part, a capacitance structure proximate a microchip including security sensitive circuitry, and circuitry configured to initiate an action for obstructing analysis of the security sensitive circuitry in response to a detected alteration in a capacitance associated with the capacitance structure. The circuitry may be further configured to detect the alteration of the capacitance associated with the capacitance structure.

An embodiment that is consistent with the underlying principles of the present invention may include another capacitance structure. In one embodiment, the capacitance may include the capacitance between the capacitance structures. The capacitance structures may be coplanar.

According to an aspect of the invention, the capacitance structure may be positioned on the backside of the microchip. The capacitance may be altered in response to a change in a distance between the capacitance structure and the security sensitive structure. The capacitance may be substantially unaltered in response to a change in a distance between the capacitance structure and a lid positioned atop a backside of the microchip, wherein the capacitance structure is positioned in between the backside and the lid. The capacitance structure may comprise a metallic shape.

According to another aspect of the invention, the circuitry may determine whether the capacitance is within an acceptable range. The circuitry may determine whether the capacitance exceeds a threshold value.

Embodiments consistent with the invention may include a connection connecting the capacitance structure to the circuitry. The connection may comprise a through-silicon via. Another embodiment may include program code executed by the circuitry and configured to initiate the action for obstructing analysis of the security sensitive circuitry in response to the detected alteration in the capacitance. A machine/computer readable medium bearing the program code may also be included. The action may include a shutdown, a spoofing and/or a self-destruct operation. The circuitry may include a capacitance divider. A transmitter may be configured to deliver an electrical signal to the capacitance structure.

Aspects of the invention may include a plurality of capacitance structures positioned on a surface of a microchip that includes security sensitive circuitry. Aspects of the invention may include circuitry configured to sense a capacitance present between the plurality of capacitance structures and to initiate an action for obstructing analysis of the security sensitive circuitry in response to a sufficient change in the detected capacitance.

According to another aspect of the invention, a method of protecting security sensitive circuitry of a microchip from undesired analysis is provided. The method may include sensing a change in capacitance present between multiple capacitance structures positioned proximate the microchip having the security sensitive circuitry, and initiating an action configured to obstruct analysis of the security sensitive circuitry in response to sensing the change in the capacitance. Initiating the action may further comprise initiating a shutdown, a spoofing, and/or a self-destruct operation.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

BRIEF DESCRIPTION OF THE DRAWINGS

FIG. 3 shows a table having columns of dimensions and associated capacitance measurements such as may be present in the integrated circuit assembly of FIG. 2.

FIG. 4 shows a table having dimensions and associated measured capacitances corresponding to a structure of the assembly shown in FIG. 2 and having different dimensions than those included in the table of FIG. 3.

DETAILED DESCRIPTION

Figure 1:
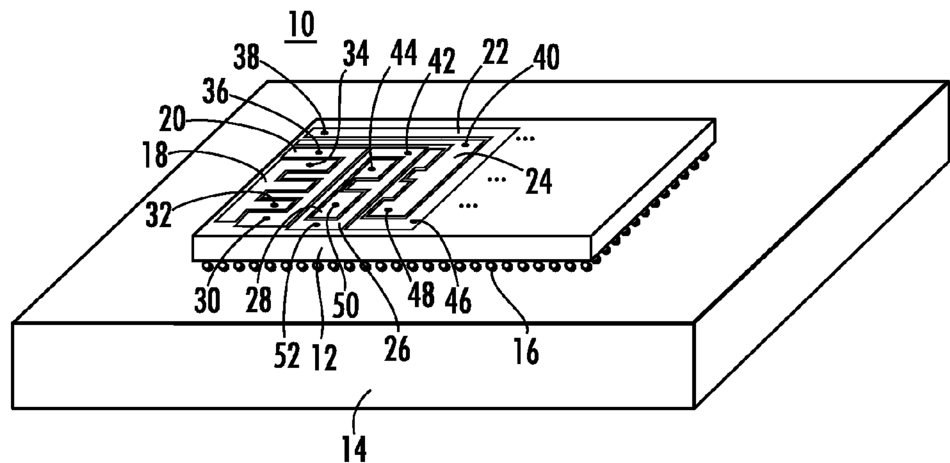
FIG. 1 shows an integrated circuit assembly having capacitance structures useful for detecting and interfering with a technology exploitation attempt in accordance with the principles of the present invention.

Embodiments consistent with the underlying principles of the present invention may detect an attempt to tamper with a microchip by detecting an unacceptable alteration in a measured capacitance associated with capacitance structures proximate the backside of a microchip. The capacitance structures typically comprise metallic shapes and may connect using through-silicon vias to active sensing circuitry within the microchip. In response to the sensed change, a shutdown, spoofing, self-destruct or other defensive action may be initiated to protect security sensitive circuitry of the microchip.

Aspects of the invention may include a plurality of coplanar capacitance structures that are formed by adding copper or another metal to the backside of a microchip die. Through-silicon vias or other connections may connect each capacitance structure to sensing circuitry. The sensing circuitry may be used to determine if the proper capacitance is present.

More particularly, an impulse may be sent from active circuitry in the microchip to coplanar capacitance structures. In one embodiment, the capacitance structures may be substituted for a copper plated lid on the backside of a microchip. Through-silicon vias may connect each capacitance structure to the detection circuitry. The impulse response may be measured by a capacitive divider at a pulse generator. Measured capacitance associated with each coplanar capacitance structure may be compared to expected results. Deviations of sufficient magnitude may trigger an output signal, connected to a destruct or shutdown function on the microchip.

Determining the capacitance between capacitance structures may be accomplished is various ways. In one embodiment, the determination process is similar to time-domain reflectometer (TDR) principles. A TDR transmits a fast rise time pulse along the conductor. If the conductor is of a uniform impedance and properly terminated, the entire transmitted pulse will be absorbed in the far-end termination and no signal will be reflected back to the TDR. But where impedance discontinuities exist, each discontinuity will create an echo that is reflected back to the reflectometer. Increases in the impedance create an echo that reinforces the original pulse while decreases in the impedance create an echo that opposes the original pulse. The resulting reflected pulse that is measured at the output/input to the TDR is displayed or plotted as a function of time and, because the speed of signal propagation is relatively constant for a given transmission medium, can be read as a function of electrical length. Analogous processes enable the sensitive monitoring of select capacitance measurements.

More particularly, transmission line theory teaches that for two conductors with an associated reference plane, capacitance can be measured by determining even and odd mode capacitances ($C_{even}$ and $C_{odd}$). An exemplary capacitance sensing circuit may include two pairs of drivers and receivers. Each driver/receiver pair may be connected to respective sides of a capacitance structure.

The even mode capacitance may be determined by setting both driver sources to send signals having the same polarity step into the capacitance structure. The receive circuitry may determine $C_{even}$ using TDR-like techniques. After $C_{even}$ is determined, the driver sources may be set to send signals having the same step, but with opposite polarity into the capacitance structure. In this manner, the receive circuitry may measure the odd mode capacitance. When both $C_{odd}$ and $C_{even}$ are determined, the capacitance between the structures may equal half of the difference between $C_{odd}$ and $C_{even}$.

Turning more particularly to the drawings, FIG. 1 shows an integrated circuit assembly 10 having capacitance structure(s) 18, 20, 22, 24, 26, 28 useful for detecting and interfering with a technology exploitation attempt. FIG. 1 more particularly includes an assembly 10 comprising a microchip 12 mounted onto a microchip carrier 14 using die bumps 16. The microchip carrier 14 generally comprises the package in which the microchip 12 is mounted for plugging into (socket mount) or soldering onto (surface mount) a printed circuit board. The capacitance structure(s) 18, 20, 22, 24, 26, 28 may reside on the backside of the microchip 12.

The relative capacitance between the capacitance structure(s) 18, 20, 22, 24, 26, 28 may be monitored to determine if a portion of the assembly 10 has undergone tampering. The proximity of the capacitance structures 18, 20, 22, 24, 26, 28 relative to one another generates, in part, the capacitance. The capacitance structures 18, 20, 22, 24, 26, 28 generally compromise metal wires, plates or other shapes.

Vias or other connections 30, 32, 34, 36, 38, 40, 42, 44, 46, 48, 50, 52 may be used to connect the capacitance structures 18, 20, 22, 24, 26, 28 to detection circuitry within the microchip 12. A through-silicon via is a type of via that generally comprises a vertical electrical connection passing through a silicon wafer or die for the purpose of creating three-dimensional packages and circuits. In one embodiment, the capacitance is measured as between respective pairs, e.g., 18 and 20, 22 and 24, 26 and 28.

In one respect, FIG. 1 shows an apparatus comprising an integrated circuit assembly 10 which includes a flip chip integrated circuit structure. Flip chip mounting typically uses die bumps 16, e.g., solder, instead of wire bonds. The die bumps 16 are deposited on the microchip pads, which are located on the top side of the wafer during the final wafer processing step. In order to mount the microchip to external circuitry (on a circuit board or another wafer or a microchip), the microchip is flipped over so that the topside faces toward the mounting area. The die bumps are used to connect directly to the associated external circuitry. Other embodiments consistent with the invention may include wirebond connections and associated processes.

Figure 2:
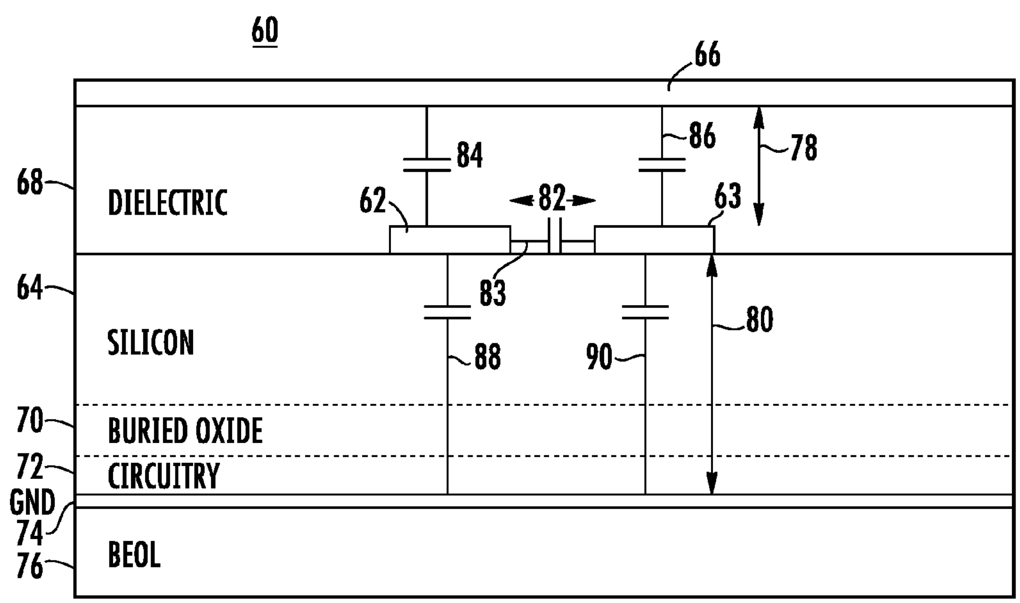
FIG. 2 shows a cross-section of an integrated circuit assembly that includes capacitance structures such as are present in the assembly of FIG. 1.

FIG. 2 shows a cross-section of an integrated circuit assembly 60 that includes capacitance structure(s) 62, 63 such as are present in the assembly 10 of FIG. 1. The integrated circuit assembly 60 further comprises a microchip including a layer of silicon 64, buried oxide 70 and active circuitry 72. A ground layer 74 may be present within the assembly 60, as may a backend of line (BEOL) 76. A BEOL may comprise layers of metal stacked to make connections between the active circuitry 72 and other devices (not shown). Ground generally refers to the reference point in an electrical circuit from which other voltages are measured. The ground layer 74 may comprise a depletion region.

A layer of dielectric material 68 may separate the silicon 64 of the microchip. A heat sink 66, or lid, may be positioned over the dielectric material 68. The heat sink 66 may be configured to be at ground voltage or may be left electrically floating.

The capacitance structure(s) 62, 63 may be positioned onto the silicon 64 of the microchip. As such, the capacitance structure(s) 62, 63 may be imbedded within the dielectric material 68. The dielectric material 68 typically comprises a thermal paste, however, it may alternatively include virtually any insulating material, including solids, liquids, or gases, in addition to vacuum space.

A distance between the capacitance structure(s) 62, 63 and the heat sink 66 is denoted in FIG. 2 by line 78. The distance between the capacitance structure(s) 62, 63 and the ground layer 74 is denoted by line 80. The distance between capacitance structure(s) 62, 63 is denoted by symbol 82. Line 80 thus corresponds generally with the height of the microchip.

Capacitor symbol 84 generally represents the capacitance present between capacitance structure 62 and the heat sink 66. Capacitor symbol 83 represents the mutual capacitance between structures 62, 63. As discussed herein, the measured capacitance 83 may change significantly as the distance of the capacitance structures 62, 63 changes relative to the active circuitry 72 and ground 74. This distance roughly corresponds to the thickness of the silicon layer and buried oxide layers 64, 70, respectively.

Capacitor symbol 86 generally represents the capacitance present between capacitance structure 63 and the heat sink 66. Similarly, the capacitor symbol 88 generally represents the capacitance present between the capacitance structure 62 and the ground layer 74. Capacitor symbol 90 generally represents the capacitance present between the capacitance structure 63 and the ground layer 74.

FIG. 3 shows a table 100 having columns of dimensions 102, 104, 106, 108 and associated capacitance measurements 110, 112, 114 such as may be present in the integrated circuit assembly 60 of FIG. 2. Table 100 of FIG. 3 generally shows that as the distance 78 between the heat sink 66 and the capacitance structures is altered, the relative capacitance listed in columns 110, 112, 114 does not change substantially. Thus, the heat sink 66 and dielectric material layer 68 may potentially be removed without initiating a defensive action.

The table 100 shows modeled results that track the capacitance between structures in response to structural changes to the integrated circuit assembly 10. As the distance 78 is varied through a normal range, a range of expected capacitance 83 is created. When the distance 78 approaches infinity, as may occur as the heat sink 66 is removed, the capacitance 83 remains within the range. As such, the destruct circuitry may remain inactivated after the innocent removal of the heat sink 66. This may contrast what happens when the capacitance structures are removed or modified, as shown below. In such an instance, tamper detection circuitry may determine an unacceptable change in capacitance has occurred and may initiate an appropriate action.

FIG. 4 shows a table 130 having columns of dimensions 132, 134, 136, 138 and associated measured capacitances 140, 142, 144 corresponding to a structure of the assembly 60 shown in FIG. 2, and having different dimensions than those included in the table 100 of FIG. 3. More particularly, the table 130 shows that changing the distance 80 between either of the capacitance structure(s) 62, 63 and ground 74 may result in capacitance measurements 83 that follow outside of an expected range. As shown in the table, the expected range is from about 0.786 pF\cm and 0.89 pF\cm. Such a change in that distance 80 is likely to result from the grinding away of the bulk silicon layer 64 and the subsequent reproduction/repositioning of the capacitance structures 62, 63.

The table 130 thus shows what happens to the capacitance 83 between the structures 62, 63 if the original structures 62, 63 are ground away, along with a portion of the bulk silicon layer 64, and then are re-deposited a smaller distance away from ground 74. In such an instance, the measured capacitance 83 will fall outside the expected range. For instance, when the distance 80 equals 30 mils, the capacitance 83 equals 0.768 pf/cm. This value falls outside the expected range of 0.786 pf/cm to 0.89 pf/cm.

The dimensions in the table 130 are measured in mils (unit of distance equal to 0.001 inch). Decreasing the distance 80 shows what might happen when the bulk silicon layer 64 is ground down and an attempt is made to reproduce the capacitance structure(s) 62, 63, as may occur during a reverse engineering process. As such, the structure of the assembly 60 may tolerate some variance in construction, however, it will nonetheless detect even subtle changes in more critical areas associated with tampering.

Figure 5:
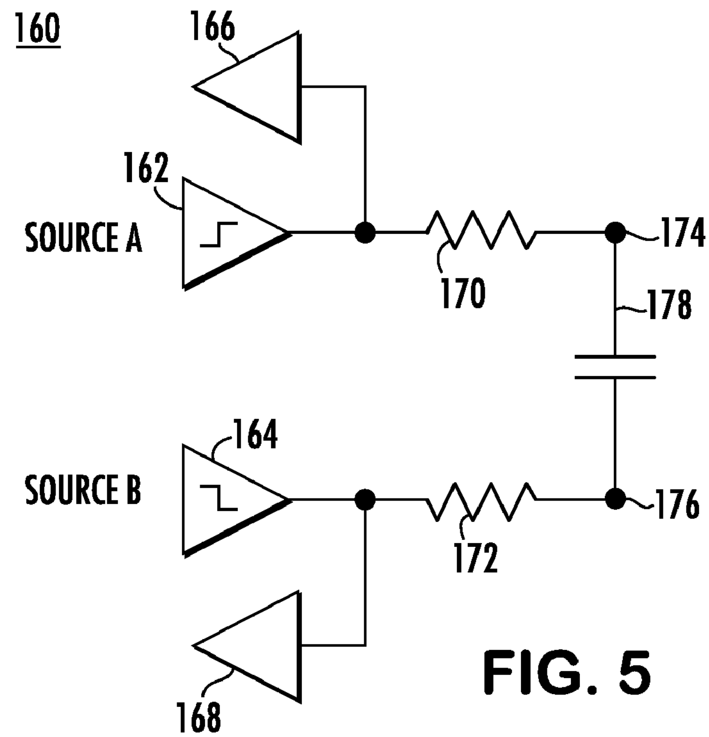
FIG. 5 shows a capacitance detection circuit configured for use in determining a capacitance associated with a capacitance structure as may reside within an integrated circuit assembly, such as shown in FIG. 2.

FIG. 5 shows a capacitance detection circuit 160 configured for use in determining a capacitance associated with a capacitance structure 62 as may reside within an integrated circuit assembly, such as shown in FIG. 2. The detection circuit 160 includes transmitting sources 162, 164 and receivers 166, 168. The capacitance detection circuit 160 may use TDR-like techniques to determine the capacitance. In equation form, the capacitance generally equals the capacitance measured when source signals have opposite polarities minus the capacitance when the source signals are even, or have the same polarity. The resultant differential may be divided by two.

The capacitance detection circuit 160 also includes resistors 170, 172 and vias or other connections 174, 176 bounding capacitor 178. The signal sources 162, 164 may drive their signals in the opposite directions to determine the odd mode capacitance; the source transmitters 162, 164 may also drive their respective signals in the same directions to determine the even mode capacitance.

Figure 6:
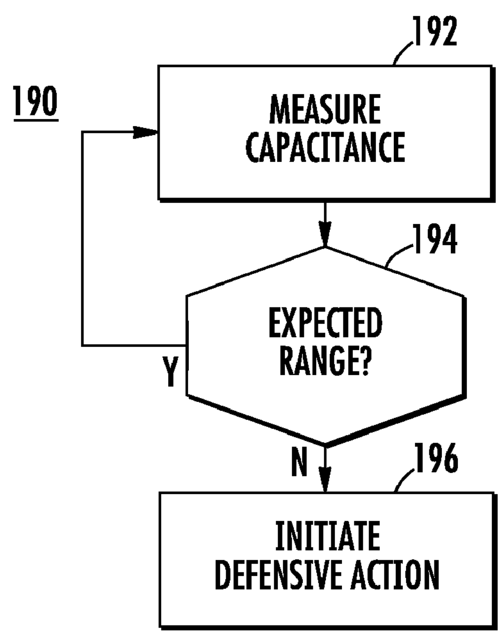
FIG. 6 shows a flowchart having steps executable by an integrated circuit assembly such as is shown in FIG. 2 for sensing an alteration in a capacitance induced by a capacitance structure and for identifying and protecting against a microchip exploitation process.

FIG. 6 shows a flowchart 190 having steps executable by an integrated circuit assembly 60 such as is shown in FIG. 2 for sensing an alteration in a capacitance induced by a capacitance structure 162. The sense alteration may be used to identify and protect against a microchip exploitation process. Turning more particularly to the steps of the flowchart 190, an embodiment may measure at block 192 capacitance associated with one or more capacitance structure(s) 62, 63. The assembly 60 may determine at block 194 if the measured capacitance(s) falls within an expected range. If the measured capacitance is within the expected range at block 194, then the assembly 60 may continue at block 192 to monitor capacitance.

Where the measured capacitance does not fall within the expected range at block 192, then an embodiment may alternatively initiate at block 196 a defensive action. Exemplary defensive actions may include shutdown, spoofing and self destruct operations, among others.

While the invention has and hereinafter will be described in the context of integrated circuit assemblies, those skilled in the art will appreciate that the various embodiments of the invention are capable of being distributed as a program product in a variety of forms, and that the invention applies equally regardless of the particular type of machine/computer readable, signal bearing media used to actually carry out the distribution. For instance, a separate processor incorporated within or otherwise in communication with an integrated circuit assembly may access memory to execute program code functions to identify tampering in a software manner that is consistent with the underlying principles of the present invention. Examples of signal bearing, machine/computer readable media include, but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In general, the routines executed to implement the embodiments of the invention, whether implemented in hardware, as part of an integrated circuit assembly, or as a specific application, component, program, engine, process, programmatic tool, object, module or sequence of instructions, or even a subset thereof, may be referred to herein as an "algorithm," "function," "program code," or simply "program." Program code typically comprises one or more instructions that are resident at various times in various memory and storage devices in a computing system. When read and executed by one or more processors, the program code performs the steps necessary to execute steps or elements embodying the various aspects of the invention. One of skill in the art should appreciate that embodiments consistent with the principles of the present invention may nonetheless use program code resident at only one, or any number of locations.

Those skilled in the art will further recognize that the exemplary environments illustrated in FIGS. 1-6 are not intended to limit the present invention. For instance, while flip chip mounting processes are used in many of the embodiments above for exemplary purposes, embodiments of the invention may have equal applicability to microchip assemblies associated with virtually any other mounting technique. Indeed, those skilled in the art will recognize that other alternative hardware and/or software environments may be used without departing from the scope of the invention.

Moreover, while the present invention has been illustrated by a description of various embodiments and while these embodiments have been described in considerable detail, it is not the intention of the Applicants to restrict, or in any way limit the scope of the appended claims to such detail. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. An apparatus comprising:

a capacitance structure proximate a microchip including security sensitive circuitry; and circuitry configured to initiate an action for obstructing analysis of the security sensitive circuitry in response to a detected alteration in a capacitance associated with the capacitance structure, wherein the action includes an operation selected from a group consisting of at least one of: a shutdown, a spoofing and a self-destruct operation.

2. The apparatus of claim 1, wherein the circuitry is further configured to detect the alteration of the capacitance associated with the capacitance structure.

3. The apparatus of claim 1, further comprising another capacitance structure.

4. The apparatus of claim 1, wherein the capacitance includes the capacitance between the capacitance structures.

5. The apparatus of claim 4, wherein the capacitance structures are coplanar.

6. The apparatus of claim 1, wherein the capacitance structure is positioned on the backside of the microchip.

7. The apparatus of claim 1, wherein the capacitance is altered in response to a change in a distance between the capacitance structure and the security sensitive structure.

8. The apparatus of claim 1, wherein the capacitance is substantially unaltered in response to a change in a distance between the capacitance structure and a lid positioned atop a backside of the microchip, wherein the capacitance structure is positioned in between the backside and the lid.

9. The apparatus of claim 1, wherein the capacitance structure comprises a metallic structure.

10. The apparatus of claim 1, wherein the circuitry determines whether the capacitance is within an acceptable range.

11. The apparatus of claim 1, wherein the circuitry determines whether the capacitance exceeds a threshold value.

12. The apparatus of claim 1 further comprising a connection connecting the capacitance structure to the circuitry.

13. The apparatus of claim 12, wherein the connection comprises a through-silicon via.

14. The apparatus of claim 1 further comprising program code executed by the circuitry and configured to initiate the action for obstructing analysis of the security sensitive circuitry in response to the detected alteration in the capacitance; and a computer readable medium bearing the program code.

15. The apparatus of claim 1, wherein the circuitry includes a capacitance divider.

16. The apparatus of claim 1 further comprising a transmitter configured to deliver an electrical signal to the capacitance structure.

17. An apparatus comprising:

a plurality of capacitance structures positioned on a surface of a microchip that includes security sensitive circuitry; and circuitry configured to sense a capacitance present between the plurality of capacitance structures and to initiate an action for obstructing analysis of the security sensitive circuitry in response to a sufficient change in the detected capacitance, wherein the action further comprises initiating an operation selected from a group consisting of at least one of: a shutdown, a spoofing and a self-destruct operation.

18. The apparatus of claim 17, wherein the circuitry determines whether the change in the capacitance is within an acceptable range.

19. A method of protecting security sensitive circuitry of a microchip from undesired analysis, the method comprising:

sensing a change in capacitance present between multiple capacitance structures positioned proximate the microchip having the security sensitive circuitry; and initiating an action configured to obstruct analysis of the security sensitive circuitry in response to sensing the change in the capacitance, wherein initiating the action further comprises initiating an operation selected from a group consisting of at least one of: a shutdown, a spoofing and a self-destruct operation.

20. The method of claim 19 further comprising determining whether the capacitance exceeds a threshold value.

* * * * *